US009588162B2

(12) United States Patent
Zibold et al.

(10) Patent No.: US 9,588,162 B2
(45) Date of Patent: Mar. 7, 2017

(54) CAPACITIVE POSITIONING DEVICE

(71) Applicant: Robert Bosch GmbH, Stuttgart (DE)

(72) Inventors: Tobias Zibold, Stuttgart (DE); Andrej Albrecht, Leinfelden-Echterdingen (DE)

(73) Assignee: Robert Bosch GmbH, Stuttgart (DE)

( * ) Notice: Subject to any disclaimer, the term of this patent is extended or adjusted under 35 U.S.C. 154(b) by 202 days.

(21) Appl. No.: 14/388,042

(22) PCT Filed: Feb. 14, 2013

(86) PCT No.: PCT/EP2013/052929
§ 371 (c)(1),
(2) Date: Sep. 25, 2014

(87) PCT Pub. No.: WO2013/143763
PCT Pub. Date: Oct. 3, 2013

(65) Prior Publication Data
US 2015/0084651 A1    Mar. 26, 2015

(30) Foreign Application Priority Data
Mar. 29, 2012 (DE) .......................... 10 2012 205 122

(51) Int. Cl.
G01R 27/26 (2006.01)
G01V 3/08 (2006.01)

(52) U.S. Cl.
CPC ......... G01R 27/2605 (2013.01); G01V 3/088 (2013.01)

(58) Field of Classification Search
CPC .......... G01B 7/023; G01B 7/003; G01B 7/02; G01B 7/14; G01B 7/287; G01R 27/2605;
(Continued)

(56) References Cited

U.S. PATENT DOCUMENTS 5,917,314 A * 6/1999 Heger .................... G01B 7/003
324/67
2007/0185611 A1* 8/2007 Magill ................ B29C 35/0288
700/199

(Continued)

FOREIGN PATENT DOCUMENTS

DE  10 2007 012 111 A1  10/2007
DE  10 2007 058 088 A1   6/2009
DE  10 2008 005 783 A1   7/2009

OTHER PUBLICATIONS

International Search Report corresponding to PCT Application No. PCT/EP2013/052929, mailed Jun. 5, 2013 (German and English language document) (6 pages).

Primary Examiner — Vincent Q Nguyen
(74) Attorney, Agent, or Firm — Maginot, Moore & Beck LLP

(57) ABSTRACT

A positioning device for capacitively detecting an object enclosed in a medium includes a measuring electrode, a reference electrode, and a receiving electrode. The measuring electrode with the receiving electrode forms a measuring capacitance, which can be influenced by the object. The reference electrode with the receiving electrode forms a reference capacitance, which cannot be influenced by the object. The positioning device further includes an oscillator configured to supply the measuring capacitance and the reference capacitance with phase-shifted AC voltages and a control device configured to control amplitudes of at least one of the AC voltages, in order to adapt effects of electrical fields of the measuring electrode or of the reference electrode on the receiving electrode to one another. The measuring, reference, and receiving electrodes are planarly formed. The measuring electrode has a larger surface area than the reference electrode.

11 Claims, 3 Drawing Sheets

(58) Field of Classification Search
CPC .... G01D 3/036; G01D 5/2405; G01D 5/2417; G01D 5/24; G01D 5/2415; G01N 27/221
USPC .................................................. 324/660–663
See application file for complete search history.

(56) References Cited

U.S. PATENT DOCUMENTS

| | | | | |
|---|---|---|---|---|
| 2010/0148802 A1* | 6/2010 | Uchida | ................ | G01D 5/2415 324/661 |
| 2011/0193573 A1* | 8/2011 | De Boer | ................ | G01B 7/023 324/686 |
| 2012/0146668 A1* | 6/2012 | Satake | ................... | B60N 2/002 324/662 |
| 2014/0292396 A1* | 10/2014 | Bruwer | ................ | H03K 17/955 327/517 |

\* cited by examiner

CAPACITIVE POSITIONING DEVICE

This application is a 35 U.S.C. §371 National Stage Application of PCT/EP2013/052929, filed on Feb. 14, 2013, which claims the benefit of priority to Serial No. DE 10 2012 205 122.8, filed on Mar. 29, 2012 in Germany, the disclosures of which are incorporated herein by reference in their entirety.

The disclosure relates to a locating appliance. In particular, the disclosure relates to a locating appliance for the capacitive detection of an object enclosed in a medium.

BACKGROUND

In order to sense an article concealed in a wall, for example a beam in a wall of lightweight construction, capacitive detectors are known. Such detectors use an electrode that has its charging or discharge behavior determined in order to infer the dielectric object. Detectors having a plurality of electrodes are also known, which involve determining a change in the capacitance of a pair of electrodes. Usually, it is necessary for such detectors to be calibrated manually on the wall, since the appliances cannot detect wall contact themselves and the capacitance of the electrodes or electrode pairs is dependent on ambient conditions, such as a temperature, a humidity, an object averted from the sensor, grounding via a user or electrical or dielectric properties of the wall material. In order to take account of these variable influencing factors, it is necessary for known appliances to be calibrated on the wall, which requires either appropriate control by a user or a complex sensor system.

DE 10 2007 058 088 A1 shows a sensor for locating dielectric objects in a medium. The sensor shown determines a ratio between a reference capacitance and a measurement capacitance, the latter being dependent on the position of the object in relation to electrodes of the two capacitances.

DE 10 2008 005 783 B4 shows a capacitive detector as a crash protection system that uses a push-pull measurement bridge to compare the capacitance of two capacitances with one another. One of the capacitances is formed by two electrodes that can be positioned relative to one another, so that a change in their relative interval can be used to generate a signal that warns of crashing.

The disclosure is based on the object of specifying a locating appliance for capacitive detection that does not require calibration in order to attain a high level of measurement accuracy.

SUMMARY

The disclosure achieves this object by means of a locating appliance having the features described herein.

There are essentially two reasons for requiring calibration of the locating appliance. Firstly, uncontrollable influences, such as an ambient temperature, an ambient humidity, an object averted from the sensor or grounding of the locating appliance via a user, can influence the output signal. Secondly, the output signal differs, regardless of the object against a medium, from an output signal in air, with a material and a material thickness of the medium and also electrical wall properties, such as a dielectric constant or a conductivity, being able to be included in the output signal.

A locating appliance for the capacitive detection of an object enclosed in a medium comprises a measurement electrode, a reference electrode and a reception electrode, wherein the measurement electrode forms, with the reception electrode, a measurement capacitance that can be influenced by the object, and the reference electrode forms, with the reception electrode, a reference capacitance that cannot be influenced by the object, and also an oscillator for supplying the measurement capacitance and the reference capacitance with phase-shifted AC voltages and a control device for controlling amplitudes of at least one of the AC voltages in order to match the influences of electrical fields from the measurement electrode or the reference electrode on the reception electrode to one another. In this case, the electrodes are of two-dimensional design by virtue of their having only small thicknesses in relation to their surfaces. In a preferred embodiment, the surfaces are furthermore flat. In addition, the measurement electrode has a greater area content than the reference electrode.

The use of the described electrode arrangement on a push-pull measurement bridge means that there can be compensation for interference factors that can influence the capacitances beteen the electrodes. Such influences may be independent of the object and the medium, such as an ambient temperature, a humidity, an object that is averted from the electrodes or grounding of a locating appliance via a user who is holding the appliance in his hand.

In a preferred embodiment, the interval between the measurement electrode and the reception electrode is greater than the interval between the reference electrode and the reception electrode.

The described push-pull measurement bridge takes a presence of the object as a basis for determining the alteration of a quotient that is formed by a difference between the measurement capacitance and the reference capacitance and a sum of these two capacitances. Influences that influence both capacitances in the same way therefore do not alter the measured variable. The specified geometric form of the individual electrodes means that the influenceability of the reference capacitance by the object may be reduced.

At least to some extent and particularly in the region between the measurement electrode and the reception electrode, the measurement electrode may be surrounded by a guard electrode that is connected to a constant potential. In this and other embodiments, it is appropriate for the measurement electrode, the reception electrode and the reference electrode to be arranged in the same plane. In this case, the guard electrode can likewise run in this plane. The constant potential may correspond to the appliance ground, in particular. In the plane, the guard electrode provides shielding that is adjusted for a predetermined potential, particularly one that is constant over time. Hence, no additional involvement is required in order to implement the shielding, and passive shielding of this kind is effective particularly when the potential on the reception electrode is adjusted, on the basis of the regulatory condition, such that AC voltage components that are in sync with the AC voltages described above disappear. The guard electrode can therefore improve the determination quality of the locating appliance in conjunction with the described push-pull measurement bridge.

The measurement electrode, the reference electrode and the reception electrode may be situated in one plane, wherein a shielding electrode that is connected to a constant potential and at least partially or, preferably, completely covers the electrodes situated in the plane is arranged on a side that is averted from the object. An influence of an object that is not intended to be detected, particularly of a user of the locating appliance, may be reduced as a result. In one variant, the coverage may also provide just partial coverage, for example the reception electrode or the reference electrode may be excluded from the coverage.

In another embodiment, which can be combined with the aforementioned embodiment, the support material has a recess between the measurement electrode and the reception electrode.

In yet another embodiment, which can be combined with the aforementioned embodiment, the reference electrode and the reception electrode are arranged on a surface of a flat support material, wherein the support material has a recess between the reference electrode and the reception electrode.

The aim of both measures is for a number of electrical field lines to be minimized by the support material between the measurement electrode and the reception electrode and between the reference electrode and the reception electrode. An influence on the measurement capacitance or on the reference capacitance as a result of properties of the support material may be reduced as a result, and a dependency of the capacitances on temperature and moisture may be simplified.

The guard electrode may be electrically connected to the shielding electrode. The two different types of shielding may thus be connected to one another in a simple manner. This can contribute to the locating appliance being of simple design, which allows production and development costs to be saved.

A multiplicity of conductor pieces for electrically connecting the shielding electrode to the guard electrode may be situated between the measurement electrode and the reception electrode.

In another embodiment, which can be combined with the aforementioned embodiment, the measurement electrode and the reception electrode are arranged on a surface of a flat support material, wherein the support material has a recess between the measurement electrode and the reception electrode, at least some of the delimitation of said recess being provided with a conductive layer that is electrically connected to the shielding electrode and the guard electrode.

The aim of both variants of the vertical contact-connection is for the electrical connection between the guard electrode and the shielding electrode to be designed, in a region between the measurement electrode and the reception electrode, such that electrical field lines, particularly those through the support material, are shielded between the measurement electrode and the reception electrode. A fundamental capacitance between the measurement electrode and the reception electrode may be reduced as a result. This means that the sensitivity of the measurement circuit toward an influence of the object may be increased. An influence on the fundamental capacity by properties of the support material may be reduced as a result and a dependency of the fundamental capacitance on temperature and moisture may be simplified.

The measurement electrode, the reference electrode and the shielding electrode may each be coated with an insulating layer. An electrical influence by the medium, for example, on the reference or measurement capacitance may be reduced as a result. In particular, the insulating layer can be used as a moisture barrier, so that humidity cannot penetrate the support material and influence the capacitances.

The measurement electrode or the reference electrode may comprise a plurality of sections that are at intervals from one another and that are connected to one another with low electrical impedance. The electrodes may thus be arranged such that two-dimensional determinability of the object is made possible.

The measurement electrode or the reference electrode may comprise a plurality of sections that are electrically insulated from one another and that have unequal but mutually proportional signals applied to them. A sensitivity of the electrode arrangement may therefore have different magnitudes in different directions.

BRIEF DESCRIPTION OF THE DRAWINGS

The invention disclosure is now described more precisely with reference to the appended figures, in which.

DETAILED DESCRIPTION

Figure 1:
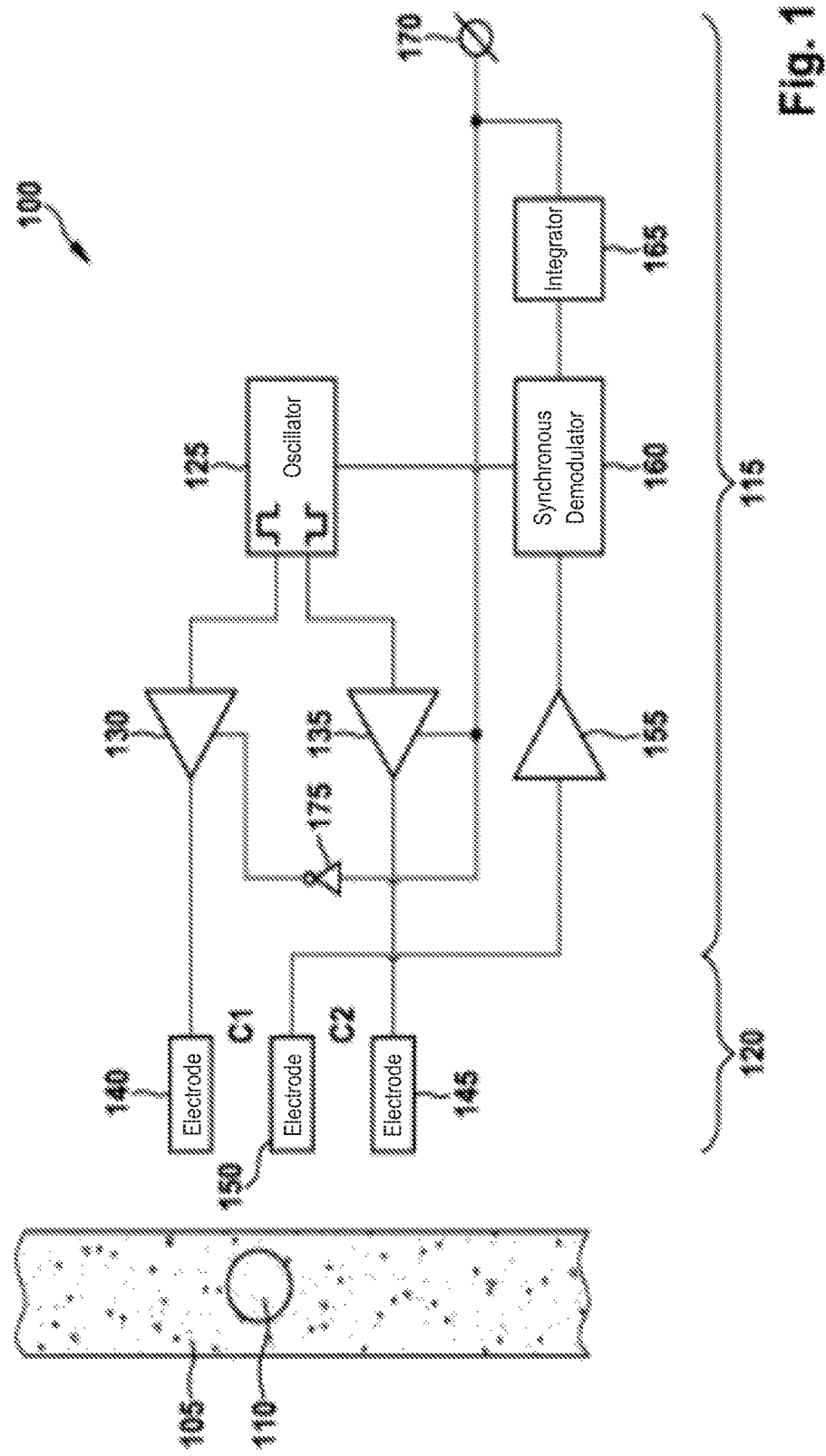
FIG. 1 shows a locating appliance.

FIG. 1 shows a locating appliance 100 for the capacitive detection of an object 110 enclosed in a medium 105.

The locating appliance 100 comprises a push-pull measurement bridge 115 and an arrangement 120 of electrodes.

An oscillator 125 provides two phase-shifted AC voltages, preferably in antiphase, at the same frequency on the measurement bridge 115. The two AC voltages are routed to two amplifiers 130 and 135, at least one of which can have its gain factor controlled by means of a signal. The output of the first amplifier 130 is connected to a measurement electrode 140 and the output of the second amplifier 135 is connected to a reference electrode 145.

The arrangement 120 comprises at least the electrodes 140 and 145 and also a ground-free reception electrode 150. The electrodes 140, 145 and 150 are arranged relative to one another such that a measurement capacitance C1 becomes established between the measurement electrode 140 and the reception electrode 150 and a reference capacitance C2 becomes established between the reference electrode 145 and the reception electrode 150. In this case, the electrodes 140, 145 and 150 are designed such that the measurement capacitance C1 can be influenced by the object 110, whereas the reference capacitance C2 cannot, or can to a negligibly small extent.

The reception electrode 150 is connected to a measurement amplifier 155, the output of which is connected to a synchronous demodulator 160. On the basis of a clock signal that is provided by the oscillator 125 and the frequency of which corresponds to that of the AC voltages that are provided for the amplifiers 130 and 135, the influences of the measurement electrode 140 and the reference electrode 145 on the reception electrode 150 are determined at alternate times and provided for an integrator 165, which may be in the form of an integrating comparator, for example. An output of the integrator 165 is connected to an interface 170 at which a measurement signal is provided. Furthermore, the measurement signal is used to control the gain factors of at least one of the amplifiers 130 and 135. If both amplifiers 130, 135 are controllable, an inverter 175 is provided in order to control the gain factors in opposite directions.

The push-pull measurement bridge 115 is set up to apply AC voltages to the measurement electrode 140 and the reference electrode of the arrangement 120 such that the effect of a dielectric influence of the object 110 on the capacitances C1 and C2 at the reception electrode 150 is of equal magnitude. In this case, the reference capacitance C2 is of a physical design such that it cannot or practically cannot be influenced by the object 110. If the object 110 is situated asymmetrically in the region of the electrodes 140, 145, for example, so that the capacitances C1 and C2 are influenced by the object 110 dielectrically to different degrees, the AC voltages have unequally high amplitudes, so that the influences of the measurement electrode 140 and the reference electrode 145 on the reception electrode 150 are the same on average over time. The measurement signal provided at the interface 170 reflects the modulation of the amplifiers 130, 135. If the measurement signal is higher or lower than a predetermined value that corresponds to a nonexistent object 110, it is possible to infer the object 110 from the measurement signal.

Figure 2A:
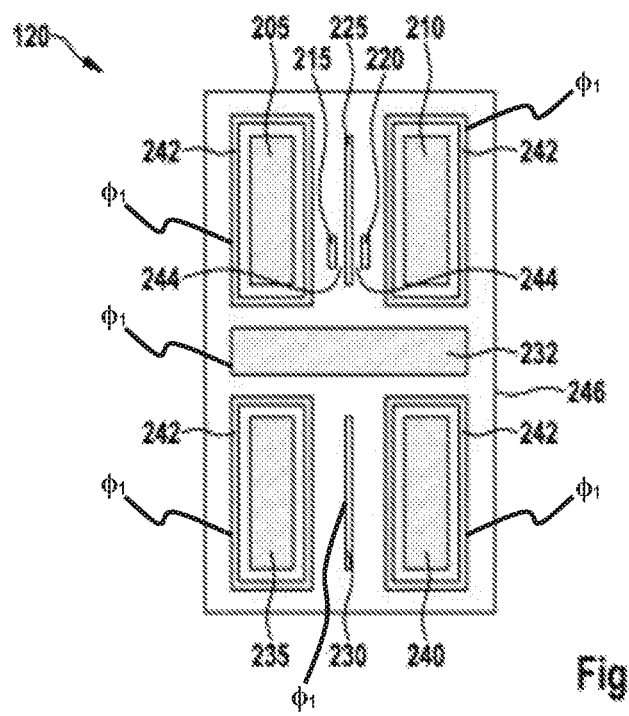
FIGS. 2A and 2B show an arrangement of electrodes for the locating appliance in FIG. 1.
Figure 2B:
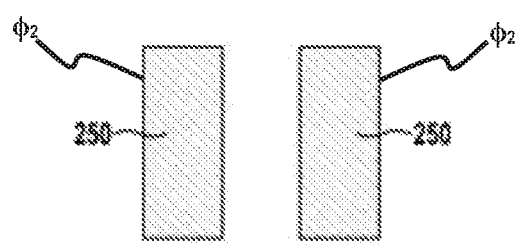
Figure 2B:
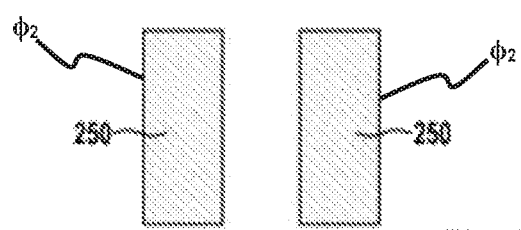

FIGS. 2A and 2B show the arrangement 120 of electrodes for the locating appliance 100 from FIG. 1. In this case, FIG. 2A shows electrodes in a first plane, which faces the object 110, and FIG. 2B shows an arrangement of electrodes in a second plane, which is averted from the object 110 in relation to the first plane. In practice, the arrangement shown may be in the form of a printed circuit on different layers of a board made of insulating material, for example.

In FIG. 2A, the first plane contains a first measurement electrode 205 and a second measurement electrode 210, which each correspond to the measurement electrode 140 in FIG. 1, a first reference electrode 215 and a second reference electrode 220, which each correspond to the reference electrode 145 from FIG. 1, and a reception electrode 225, which corresponds to the reception electrode 115 from FIG. 1, and a guard electrode 242. Mutually corresponding electrodes 205 and 210, 215 and 220 may be electrically connected to one another at low impedance. In another embodiment, mutually corresponding electrodes 205-220 have signals applied to them that are the same or not the same but proportional to one another and that may come from different sources. For this purpose, a dedicated amplifier 130 may be provided in the measurement bridge 115 from FIG. 1 for each of the measurement electrodes 205 and 210, for example. Each of the duplicate electrodes 205 and 210, 215 and 220 may also be in single form.

The reference electrodes 215, 220 are smaller than the measurement electrodes 205 and 210, specifically preferably much smaller, so that the area content of a measurement electrode 205, 210 is a multiple of the area content of a reference electrode 215, 220. Preferably, the measurement electrodes 205 and 210 are of equal magnitude. Likewise preferably, the reference electrodes 215, 220 are of equal magnitude.

Preferably, the measurement electrodes 205 and 210 are at a greater distance from the reception electrode 225 than the reference electrodes 215 and 220, specifically at a much greater distance, so that the distances from the measurement electrodes 205 and 210 to the reception electrode 225 are each a multiple of the distances from the reference electrodes 215 and 220 to the reception electrode 225. Preferably, the interval between the first measurement electrode 205 and the reception electrode 225 corresponds to the interval between the second measurement electrode and the reception electrode 225. Likewise preferably, the interval between the first reference electrode 215 and the reception electrode 225 corresponds to the interval between the second reference electrode 220 and the reception electrode 225.

Optionally, the arrangement 120 furthermore contains a first opposing electrode 235 and possibly also a second opposing electrode 240. The measurement electrodes 205, 210 and the opposing electrodes 235, 240 are preferably at the same magnitude and are arranged horizontally and vertically at intervals of the same magnitude from one another. The measurement electrodes 205 and 210 and also the opposing electrodes 235 and 240 may each be surrounded by a guard electrode 242.

Approximately in the center of FIG. 2*a* there runs a guard electrode 232 in a horizontal direction, isolating the measurement electrodes 205 and 210 arranged at the top, the respective associated guard electrodes 242, the reference electrodes 215 and 220 and the first reception electrode 225 from the opposing electrodes 235 and 240 arranged at the bottom with their associated guard electrodes 242 and the further guard electrode 230 and reducing the capacitive coupling between the opposing electrodes 235, 240 and the reception electrode 225. That portion of the arrangement 120 that is situated below the horizontal guard electrode 232 in FIG. 2A can also be omitted in other embodiments.

All of the guard electrodes 230, 232, 242 are optional. The guard electrodes 242 are used to interrupt capacitive couplings between electrodes 205-225, 235, 240 situated in the first plane. The guard electrode 230 corresponds to the reception electrode 225 and increases the symmetry of the electrode arrangement and hence of the field line distribution. The guard electrodes 230, 232, 242 are connected to a predetermined potential $\phi_1$, particularly one that is constant over time, for example to an appliance ground of the locating appliance 100 from FIG. 1. This approach differs from known active shielding in that the potential of the guard electrodes is constant over time and is not tracked to another potential. The guard electrodes 242 are particularly suitable when the push-pull measurement bridge 115 shown in FIG. 1 is used, since the measurement bridge 115 is set up to adjust the potential on the reception electrode 150 such that AC voltage components that are in sync with the clock of the AC voltages on the measurement electrode 140 and the reference electrode 145 disappear.

Insulation between adjacent electrodes in the first plane can also be provided by means of air by virtue of a recess 244 being introduced between the electrodes, as shown by way of example between the first reference electrode 215 and the reception electrode 225 and between the second reference electrode 220 and the reception electrode 225.

In the preferred embodiment shown, all of the electrodes 205-242 of the arrangement 120 are covered by an insulating layer 246 in order to hamper resistive coupling to the medium 105 of the ambient air or to another object. The insulating layer is also used as a moisture barrier, so that moisture, for example from the air, cannot get into the support material and influence the capacitances.

FIG. 2B shows four shielding electrodes 250, which are each proportioned and positioned such that they cover one of the measurement electrodes 205, 210 or one of the opposing electrodes 235, 240 together with the possibly associated guard electrode 242. The shielding electrodes 250 are connected at the locating appliance 100 to a potential $\phi_2$ that is constant over time and that may correspond to an appliance ground of the locating appliance 100. In addition or alternatively, the shielding electrodes 250 may be connected to the guard electrodes 242. The shielding electrodes 250 may also be protected from external influences by means of an insulating layer 246-not shown.

Figure 3:
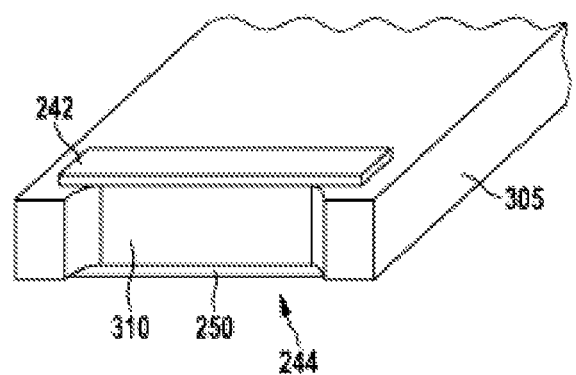
FIG. 3 shows an electrical connection between electrodes on the arrangement in FIGS. 2A and 2B.

FIG. 3 shows an electrical connection between different planes of the arrangement 120 in FIGS. 2A and 2B.

The recess 244 is made in a board 305 that carries the first plane from FIG. 2A on its top and the second plane from FIG. 2B on its bottom. The recess 244 is made in the board 305 between the reference electrode 145 and the reception electrode 150. The recess 244 is optionally provided with a conductive layer 310 on at least one side, said conductive layer being electrically connected at the top to one of the electrodes of the first plane, in this case the guard electrode 242, for example, and at the bottom to one of the electrodes of the second plane, in this case the shielding electrode 250, for example. In a further example, the recess 244 may be made in the board 305 between the measurement electrode 140 and the reception electrode 150. In this case, the conductive layer 210 preferably makes electrical contact between the guard electrode 242 on the top and the shielding electrode 250 on the bottom.

Figure 4:
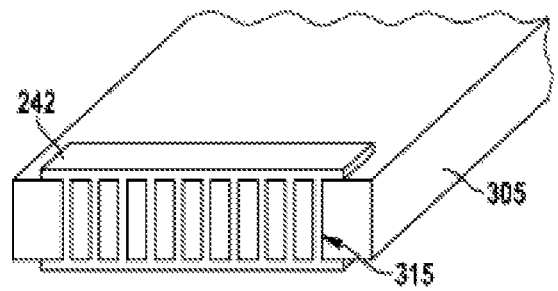
FIG. 4 shows an alternative electrical connection between electrodes on the arrangement in FIGS. 2A and 2B.

An alternative mechanical form of the electrical connection is shown in FIG. 4. Instead of the recess 244, a number of vertical holes are made in the board 305 and have conductor pieces 315 passing through them. The conductor pieces 315 are preferably produced as plated-through holes (vias), for example by means of electroplating or riveting.

The two variants shown in FIGS. 3 and 4 are used for producing an air-filled region and optionally a conductor piece in the vertical direction in order to shield an electrical field between electrodes that are situated opposite one another in respect of the conductor piece in the plane. Both embodiments may be provided in addition or as an alternative to a guard electrode 242 that can be used for the same purpose.

The invention claimed is:

1. A locating appliance for capacitive detection of an object enclosed in a medium, comprising:
   a measurement electrode;
   a reference electrode;
   a reception electrode, the measurement electrode and the reception electrode configured to form a measurement capacitance that is influenced by the object, and the reference electrode and the reception electrode configured to form a reference capacitance that is influenced by the object, the measurement capacitance being more sensitive to the object than the reference capacitance;
   an oscillator connected to the measurement electrode and the reference electrode, the oscillator configured to supply the measurement electrode and the reference electrode with phase-shifted AC voltages; and
   a control device connected to the reception electrode, the control device configured to control amplitudes of at least one of the AC voltages in order to match influences of electrical fields from the measurement electrode and the reference electrode on the reception electrode to one another, the control being performed based on a signal received from the reception electrode,
   wherein the measurement electrode, the reference electrode, and the reception electrode are in two-dimensional form, and
   wherein the measurement electrode has a greater area content than the reference electrode.

2. The locating appliance as claimed in claim 1, wherein a distance between the measurement electrode and the reception electrode is greater than a distance between the reference electrode and the reception electrode.

3. The locating appliance as claimed in claim 1, further comprising:
   a guard electrode configured to surround the measurement electrode at least to some extent, the guard electrode being connected to a constant potential.

4. The locating appliance as claimed in claim 3, wherein the measurement electrode, the reference electrode and the reception electrode are situated in one plane, the locating appliance further comprising:
   a shielding electrode that is connected to another constant potential and at least partially covers the measurement electrode, the reference electrode, and the reception electrode situated in the plane, the shielding electrode being arranged on a side that is averted from the object.

5. The locating appliance as claimed in claim 4, wherein the guard electrode is electrically connected to the shielding electrode.

6. The locating appliance as claimed in claim 5, further comprising:
   a plurality of conductor pieces configured to electrically connect the shielding electrode to the guard electrode, the plurality of conductor pieces being situated between the measurement electrode and the reception electrode.

7. The locating appliance as claimed in claim 5, further comprising:
   a flat support material having a surface on which the measurement electrode and the reception electrode are arranged, the support material having a recess between the measurement electrode and the reception electrode.

8. The locating appliance as claimed in claim 7, wherein at least some of a delimitation of the recess is defined by a conductive layer that is electrically connected to the shielding electrode and the guard electrode.

9. The locating appliance as claimed in claim 1, wherein the measurement electrode, the reference electrode and the shielding electrode are each coated with an insulating layer.

10. The locating appliance as claimed in claim 1, wherein the measurement electrode or the reference electrode comprises a plurality of sections that are at intervals from one another and that are connected to one another with low electrical impedance.

11. The locating appliance as claimed in claim 1, wherein at least one of the measurement electrode and the reference electrode comprises a plurality of sections that are electrically insulated from one another and that have unequal but mutually proportional signals applied to them.

* * * * *